(12) United States Patent
Wang et al.

(10) Patent No.: US 12,069,956 B2
(45) Date of Patent: Aug. 20, 2024

(54) THIN FILM ANISOTROPIC MAGNETORESISTOR DEVICE AND FORMATION

(71) Applicant: TEXAS INSTRUMENTS INCORPORATED, Dallas, TX (US)

(72) Inventors: Fuchao Wang, Plano, TX (US); Christopher Eric Brannon, Allen, TX (US); William David French, San Jose, CA (US); Dok Won Lee, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 17/487,877

(22) Filed: Sep. 28, 2021

(65) Prior Publication Data
US 2023/0096573 A1 Mar. 30, 2023

(51) Int. Cl.
| | |
|---|---|
| *H10N 50/01* | (2023.01) |
| *G01R 33/00* | (2006.01) |
| *G01R 33/09* | (2006.01) |
| *H01L 21/306* | (2006.01) |
| *H10N 50/10* | (2023.01) |
| *H10N 50/80* | (2023.01) |
| *H10N 59/00* | (2023.01) |

(52) U.S. Cl.
CPC ......... *H10N 50/01* (2023.02); *G01R 33/0052* (2013.01); *G01R 33/096* (2013.01); *H01L 21/30604* (2013.01); *H10N 50/10* (2023.02); *H10N 50/80* (2023.02); *H10N 59/00* (2023.02)

(58) Field of Classification Search
CPC ....................................................... H10N 50/01
USPC ............................................................. 438/3
See application file for complete search history.

(56) References Cited

U.S. PATENT DOCUMENTS

| | | | | |
|---|---|---|---|---|
| 7,808,048 B1* | 10/2010 | Hill | ......................... | H01L 28/20 257/E27.047 |
| 2003/0124854 A1* | 7/2003 | Parker | .................... | H10B 61/00 257/E27.005 |
| 2004/0042261 A1* | 3/2004 | Tuttle | ..................... | H10B 61/00 365/158 |
| 2014/0159717 A1* | 6/2014 | Paci | .................. | G01R 33/0052 324/252 |

(Continued)

*Primary Examiner* — Jami Valentine Miller
(74) *Attorney, Agent, or Firm* — Andrew R. Ralston; Frank D. Cimino

(57) ABSTRACT

Apparatus, and their methods of manufacture, including an integrated circuit device having metallization layers for interconnecting underlying electronic devices. Contacts contact conductors of an uppermost one of the metallization layers. A planarized first dielectric layer covers the contacts and the uppermost one of the metallization layers. An anisotropic magnetoresistive (AMR) stack is on the first dielectric layer between vertically aligned portions of an etch stop layer formed on the first dielectric layer and a second dielectric layer formed on the etch stop layer. Vias extend through the first dielectric layer to electrically connect the AMR stack and the contacts. A chemical-mechanical planarization (CMP) stop layer is on the AMR stack. A third dielectric layer is on the CMP stop layer. A passivation layer contacts the second dielectric layer portions, the third dielectric layer, and each opposing end of the AMR stack and the CMP stop layer.

17 Claims, 8 Drawing Sheets

(56) References Cited

U.S. PATENT DOCUMENTS

| | | | |
|---|---|---|---|
| 2014/0367815 A1* | 12/2014 | Isler | H10N 50/80 |
| | | | 257/427 |
| 2022/0359814 A1* | 11/2022 | Standaert | H10N 50/80 |
| 2023/0061985 A1* | 3/2023 | Chuang | H10N 50/10 |
| 2023/0180619 A1* | 6/2023 | Kuo | H10N 50/01 |
| | | | 365/158 |

* cited by examiner

THIN FILM ANISOTROPIC MAGNETORESISTOR DEVICE AND FORMATION

TECHNICAL FIELD

The present disclosure relates generally to an integrated circuits (IC) and more particularly to ICs with integrated anisotropic magnetoresistive (AMR) sensors and methods for making the same.

BACKGROUND OF THE DISCLOSURE

Rotation sensing technology has evolved to contactless sensing via integrated AMR sensors. The current AMR sensors are formed by depositing an AMR film on a planarized surface, followed by photolithographic patterning and wet etching to form resistor portions. However, the wet etch process utilizes unique chemicals and manufacturing equipment that require extra engineering and manufacturing resources. The wet etch process also provides unsatisfactory critical dimension (CD) control and limits the reduction of device size.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces a method that includes forming a trench in a substrate. The substrate includes an IC device, a first dielectric layer, an etch stop layer interposing the IC device and the first dielectric layer, conductive vias extending from the etch stop layer to corresponding contacts of the IC device, and a second dielectric layer interposing the etch stop layer and the IC device. The trench is formed to extend through the first dielectric layer and the etch stop layer to expose ends of the vias and portions of the second dielectric layer. The method also includes forming an AMR stack on surfaces exposed by forming the trench, including surfaces of the first and second dielectric layers, the etch stop layer, and the vias. The method further includes forming a chemical-mechanical planarization (CMP) stop layer on the AMR stack within the trench, forming a third dielectric layer over the CMP stop layer, and performing CMP to remove each portion of the third dielectric layer and the AMR stack disposed above the CMP stop layer.

The present disclosure also introduces an apparatus including an integrated circuit device having metallization layers for interconnecting underlying electronic devices. Contacts are formed on corresponding conductors of an uppermost one of the metallization layers. A planarized first dielectric layer covers the contacts and the uppermost one of the metallization layers. An AMR stack is on the first dielectric layer between vertically aligned portions of an etch stop layer formed on the first dielectric layer and a second dielectric layer formed on the etch stop layer. Vias each extend through the first dielectric layer to electrically connect the AMR stack and two of the contacts. A CMP stop layer is on the AMR stack. A third dielectric layer is on the CMP stop layer. A passivation (PO) layer contacts the second dielectric layer portions, the third dielectric layer, and each opposing end of the AMR stack and the CMP stop layer.

The present disclosure also introduces a method of forming an electronic device comprising forming a trench in a first dielectric layer over a semiconductor substrate and forming an AMR stack on sidewalls and a bottom of the trench. The AMR stack includes a portion overlying the substrate lateral to the trench. A second dielectric layer is formed within the trench. The second dielectric layer overlies the substrate lateral to the trench. The method also comprises removing the portion of the second dielectric layer overlying the substrate lateral to the trench, as well as removing the portion of the AMR stack overlying the substrate lateral to the trench.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
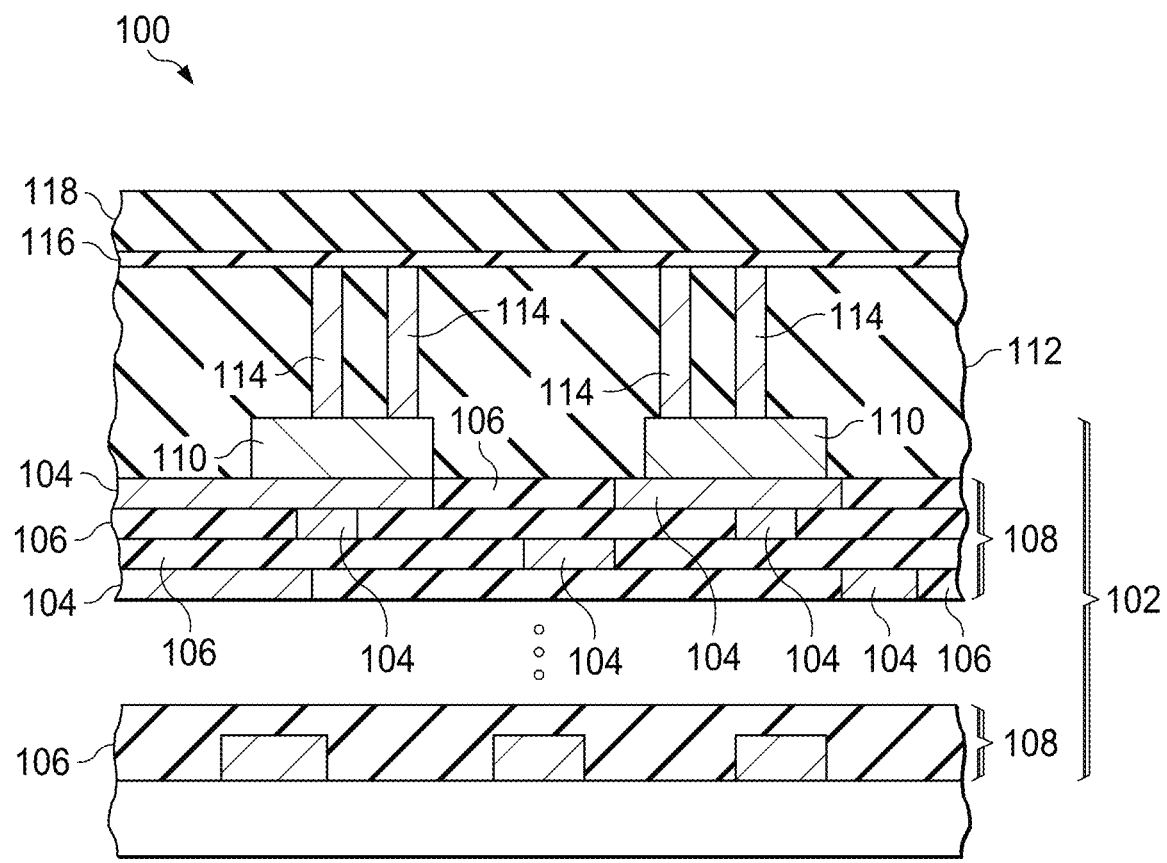
FIG. 1 is a sectional side view of a portion of an example implementation of apparatus in an intermediate stage of manufacturing according to one or more aspects of the present disclosure.

The following disclosure is described with reference to the attached figures. The figures are not drawn to scale, and they are provided merely to illustrate the disclosure. Several aspects of the disclosure are described below with reference to example implementations for illustration. It should be understood that numerous specific details, relationships, and methods are set forth to provide an understanding of the disclosure. However, the following disclosure is not limited by the illustrated ordering of acts or events, some of which may occur in different orders and/or concurrently with other acts or events, yet still fall within the scope of the following disclosure. Moreover, not all illustrated acts or events are required to implement a methodology in accordance with the following disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by embodiments directed to example devices, it is not intended that these illustrations be a limitation on the scope or applicability of the present invention. It is not intended that the example devices of the present invention be limited to the physical structures illustrated. These structures are included to demonstrate the utility and application of the present invention to example (and perhaps preferred) implementations.

It is also to be understood that the following disclosure may provide different examples for implementing different features of various implementations. Specific examples of components and arrangements are described below to simplify the present disclosure. These are, of course, merely examples and are not intended to be limiting. In addition, the following disclosure may repeat reference numerals and/or letters in more than one implementation. This repetition is for simplicity and clarity and does not in itself dictate a relationship between the various implementations and/or configurations discussed. Moreover, the formation of a first feature over or on a second feature in the description that follows may include implementations in which the first and second features are formed in direct contact and/or implementations in which additional features may be formed interposing the first and second features, such that the first and second features may not be in direct contact.

FIG. 1 is a sectional side view of a portion of an example implementation of an apparatus 100 in an intermediate stage of manufacture according to one or more aspects of the present disclosure. The apparatus 100 includes an unreferenced semiconductor substrate in/over which an IC device 102 has been formed. The IC device 102 may comprise a plurality of unreferenced integrated components, perhaps including one or more active components (such as transistors, diodes, etc.), one or more passive components (such as resistors, capacitors, inductors, transformers, etc.), one or more electromechanical components (such as microelectromechanical systems (MEMS), piezoelectric components, etc.), and/or other components. Such components may be interconnected by traces, vias, and/or other conductors 104 (such as are separated by intermetallic dielectric layers 106 in a plurality of metallization layers 108) to form an integrated system comprising a plurality of integrated devices, such as diodes, switches, bridges, transducers, converters, buffers, sensors (e.g., Hall effect sensors), detectors, antennas, and/or other devices. However, for the sake of clarity, just a portion of the IC device 102 is shown in FIG. 1, and the IC device 102 and semiconductor substrate are not shown in many subsequent figures, so that the following description may be focused on the formation of an AMR device above the IC device 102.

The IC device 102 also includes a plurality of contacts 110 formed on uppermost ones of the conductors 104. The contacts 110 may be formed of copper (Cu), aluminum (Al), gold (Au), an aluminum-silicon alloy (Al—Si), an aluminum-copper alloy (Al—Cu, e.g., $CuAl_2$), and/or other materials. The thickness of the contacts 110 may be in the range of 1,000-10,000 angstroms (Å), although other thicknesses are also within the scope of the present disclosure.

A dielectric layer 112 is formed over the IC device 102. For example, the dielectric layer 112 may be formed of silicon nitride (SiNx) or silicon oxide (SiOx), perhaps to a thickness in the range of 5,000-15,000 Å, although other materials and thicknesses are also within the scope of the present disclosure. The dielectric layer 112 may be formed using plasma enhanced chemical vapor deposition (PECVD), followed by CMP, although other processes may also or instead be utilized.

Vias 114 extend through the dielectric layer 112 into contact with the contacts 110. For example, two vias 114 may extend through the dielectric layer 112 and make a conductive connection with each contact 110. The vias 114 may be formed of tungsten (W), Cu, Al, Au, Al—Si, Al—Cu, and/or other materials, and may have a width in the range of 2,000-5,000 Å, or other widths. The vias 114 may be formed by PECVD, followed by CMP or etch back, and/or other processes.

An etch stop layer 116 covers the dielectric layer 112 and the vias 114. The etch stop layer 116 may be SiNx and/or other materials formed by PECVD. The etch stop layer 116 may have a thickness of 500 Å or otherwise in the range of 250-1,000 Å.

A dielectric layer 118 covers the etch stop layer 116. The dielectric layer 118 may be SiOx and/or other materials formed by PECVD, perhaps to a thickness of 4,000 Å or otherwise in the range of 2,500-7,500 Å.

Figure 2:
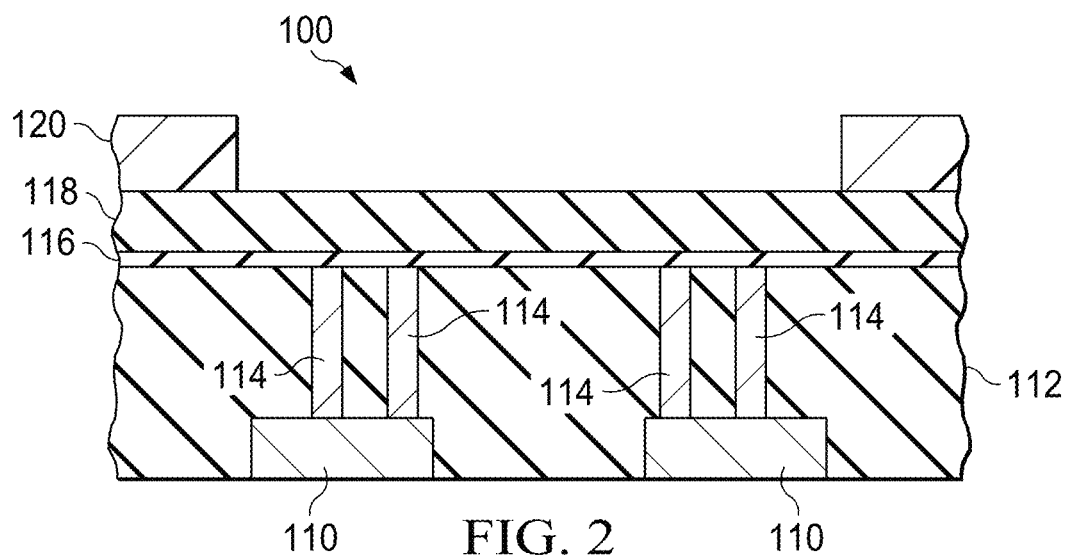
FIG. 2 is a sectional side view of the apparatus shown in FIG. 1 in a subsequent stage of manufacturing according to one or more aspects of the present disclosure.

FIG. 2 is a sectional side view of the apparatus 100 shown in FIG. 1 in a subsequent stage of manufacture according to one or more aspects of the present disclosure, in which a photoresist layer (PR) 120 has been formed on the dielectric layer 118. The PR 120 has also been patterned with a pattern to be transferred to underlying layers, as depicted in FIG. 3.

Figure 3:
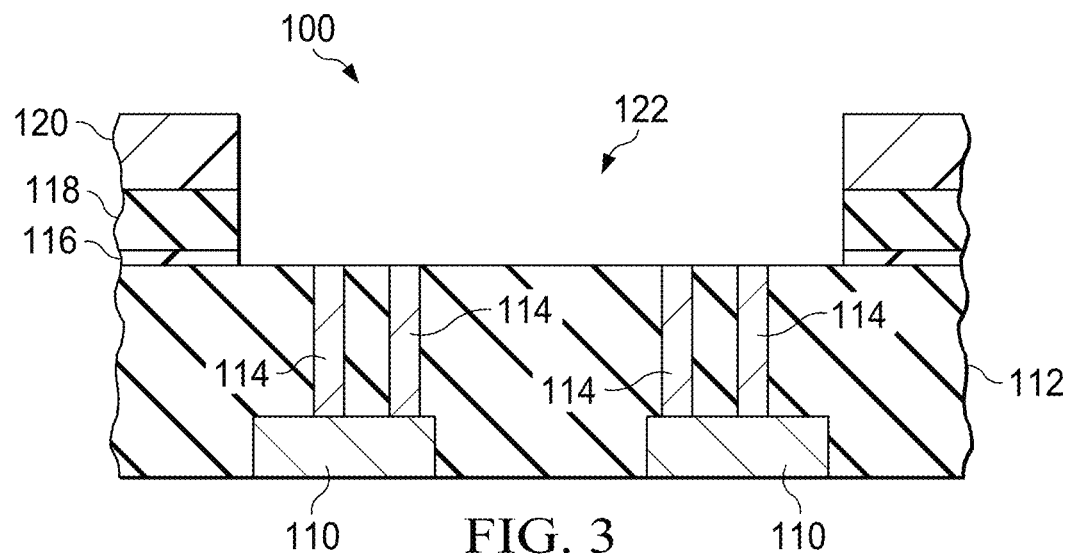
FIG. 3 is a sectional side view of the apparatus shown in FIG. 2 in a subsequent stage of manufacturing according to one or more aspects of the present disclosure.

FIG. 3 is a sectional side view of the apparatus shown in FIG. 2 in a subsequent stage of manufacture according to one or more aspects of the present disclosure, in which the dielectric layer 118 and the etch stop layer 116 have been etched through the patterned PR 120 to form a trench 122. Thus, the trench 122 extends through the dielectric layer 118 and the etch stop layer 116 to expose ends of the vias 114 and portions of the dielectric layer 112. The etching may utilize wet etching, dry etching, or a combination thereof. For example, a first etch process may be utilized to transfer the PR 120 pattern down through the dielectric layer 118 to the etch stop layer 116, wherein such etch process has an etch selectivity to the underlying etch stop layer 116. Thereafter, a second etch process may be utilized to transfer the PR 120 pattern through the etch stop layer 116, wherein such etch process has an etch selectivity to the underlying dielectric layer 112 and the vias 114.

Figure 4:
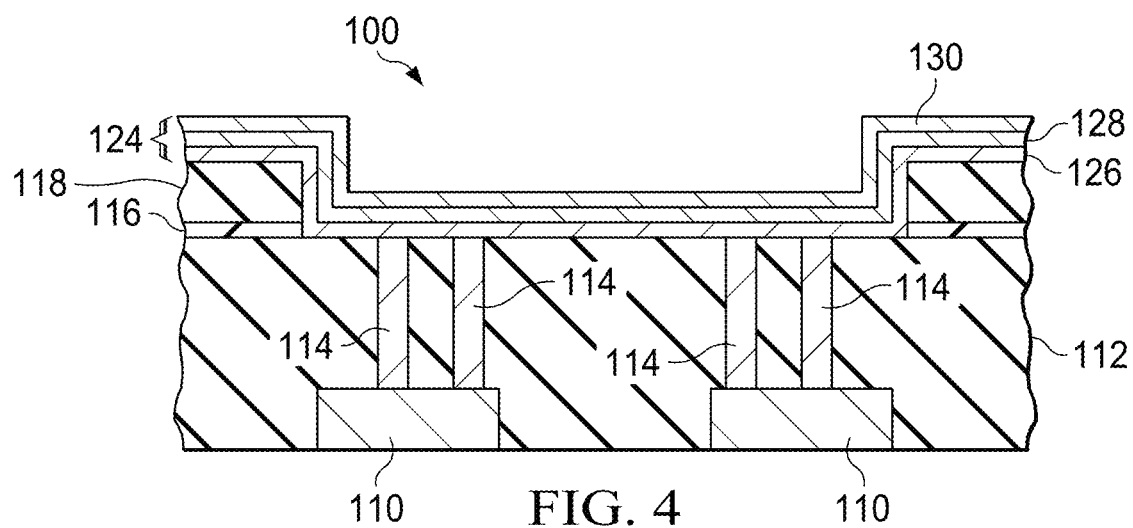
FIG. 4 is a sectional side view of the apparatus shown in FIG. 3 in a subsequent stage of manufacturing according to one or more aspects of the present disclosure.

FIG. 4 is a sectional side view of the apparatus shown in FIG. 3 in a subsequent stage of manufacture according to one or more aspects of the present disclosure. FIG. 4 depicts the apparatus after removal of the PR 120 by, for example, an oxygen (O2) or hydrogen (H2) plasma ash and wet chemical clean, and the formation of an AMR stack 124 over the dielectric layer 118 and covering the surfaces exposed by forming the trench 122. Thus, the AMR stack 124 covers sidewalls of the dielectric layer 118 and the etch stop layer 116, as well as the exposed upper surfaces of the dielectric layer 112 and the vias 114.

The AMR stack 124 may comprise an optional barrier layer 126. For example, the barrier layer 126 may be formed of tantalum nitride (TaN) and/or other materials. The barrier layer 126 may be formed by physical vapor deposition (PVD) and/or other processes to a thickness in the range of 25-500 Å.

The AMR stack 124 comprises a ferromagnetic layer 128 and an aluminum nitride (AlN) layer 130. The ferromagnetic layer 128 material may be permalloy (NiFe), though other ferromagnetic materials may be also within the scope of the disclosure. Each of these layers may be formed by PVD and/or other processes to individual thicknesses in the range of 50-500 Å.

Figure 5:
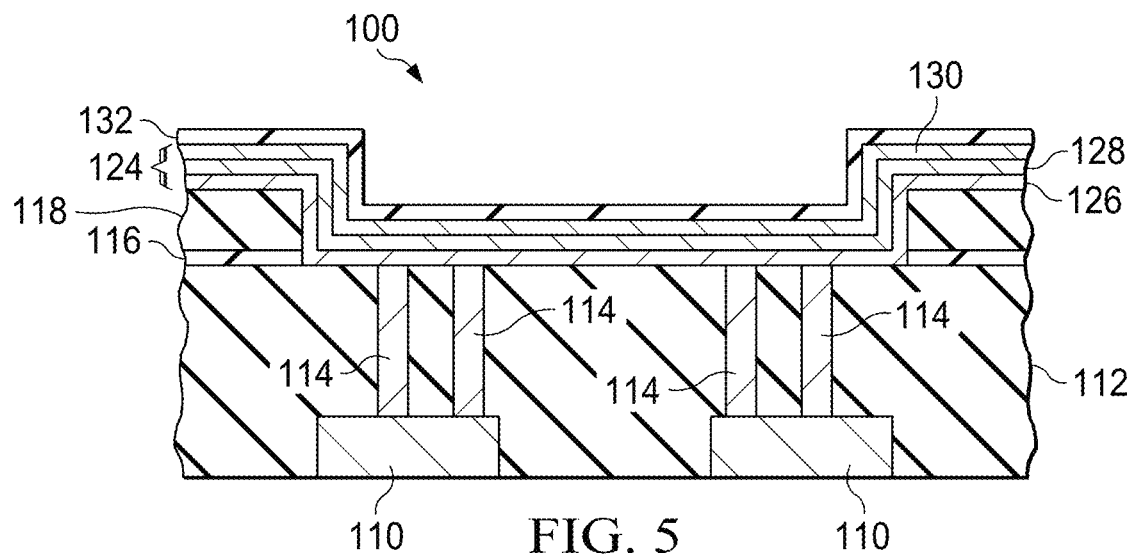
FIG. 5 is a sectional side view of the apparatus shown in FIG. 4 in a subsequent stage of manufacturing according to one or more aspects of the present disclosure.

FIG. 5 is a sectional side view of the apparatus shown in FIG. 4 in a subsequent stage of manufacture according to one or more aspects of the present disclosure, in which a CMP stop layer 132 has been formed on the exposed surfaces of the AMR stack 124. The CMP stop layer 132 may be formed of SiN and/or other materials, perhaps to a thickness of 500 Å or otherwise in the range of 250-1,000 Å.

Figure 6:
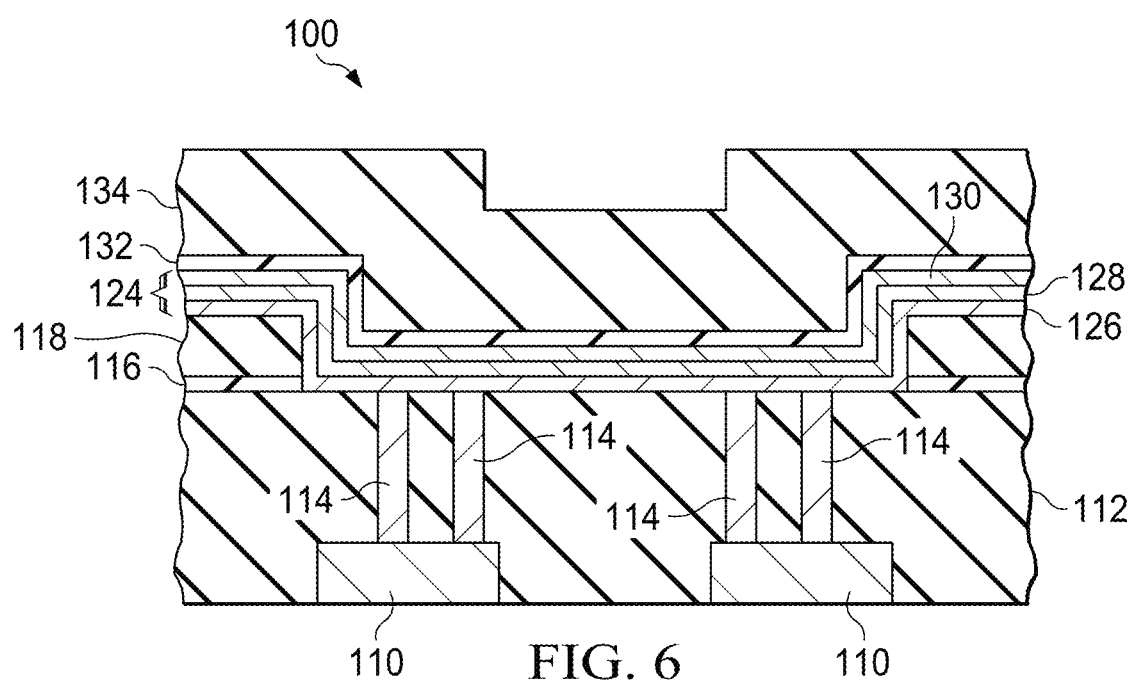
FIG. 6 is a sectional side view of the apparatus shown in FIG. 5 in a subsequent stage of manufacturing according to one or more aspects of the present disclosure.

FIG. 6 is a sectional side view of the apparatus shown in FIG. 5 in a subsequent stage of manufacture according to one or more aspects of the present disclosure, in which a dielectric layer 134 has been formed on the exposed surfaces of the CMP stop layer 132. The dielectric layer 134 may be formed of SiOx and/or other materials, perhaps to a thickness of 5,000 Å or otherwise in the range of 2,500-7,500 Å.

Figure 7:
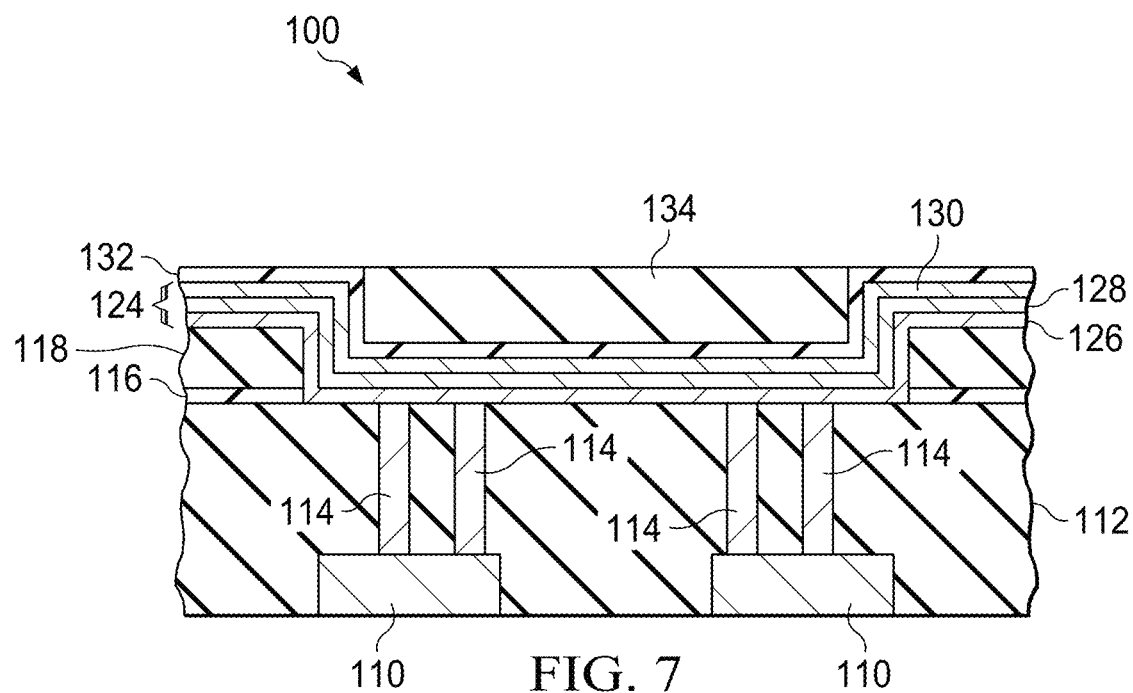
FIG. 7 is a sectional side view of the apparatus shown in FIG. 6 in a subsequent stage of manufacturing according to one or more aspects of the present disclosure.

FIG. 7 is a sectional side view of the apparatus shown in FIG. 6 in a subsequent stage of manufacture according to one or more aspects of the present disclosure, in which a CMP process has removed portions of the dielectric layer 134 so that the upper surface of the dielectric layer 134 is flush with the upper surface of the CMP stop layer 132. That is, the CMP process utilizes the CMP stop layer 132 as an end point, such that the dielectric layer 134 is polished down until the CMP stop layer 132 is exposed. In this manner, a more rigorous and rapid CMP process can be employed relative to a subsequent CMP process depicted in FIG. 8.

Figure 8:
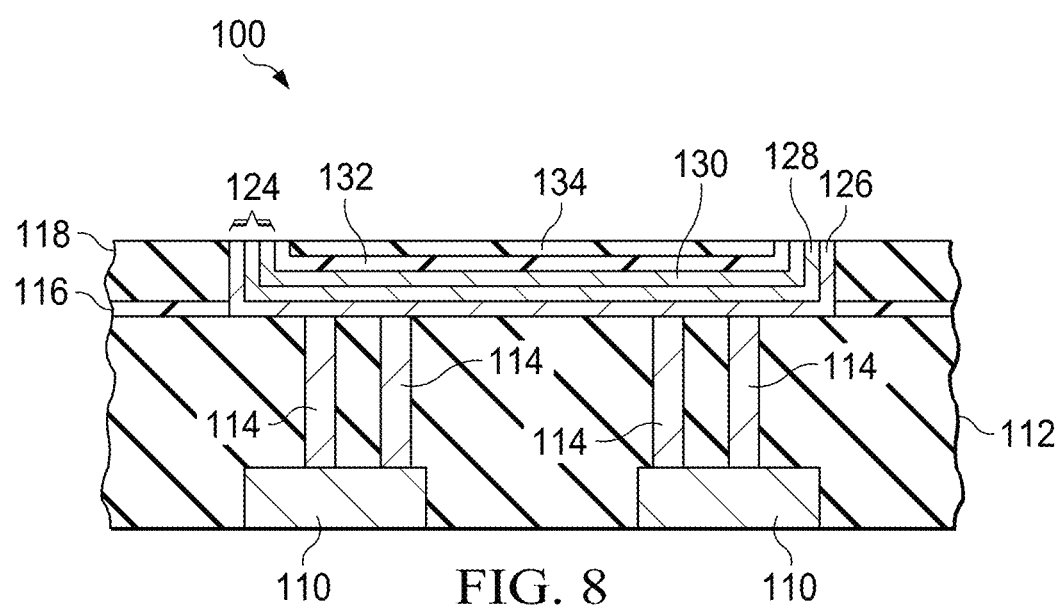
FIG. 8 is a sectional side view of the apparatus shown in FIG. 7 in a subsequent stage of manufacturing according to one or more aspects of the present disclosure.

FIG. 8 is a sectional side view of the apparatus shown in FIG. 7 in a subsequent stage of manufacture according to one or more aspects of the present disclosure, in which the additional CMP process has removed portions of the AMR stack 124, the CMP stop layer 132, and the dielectric layer 134 so that the upper surface of the dielectric layer 118 is revealed. The removal rate of the dielectric layer 132 by CMP is significantly less than the removal rate of the CMP stop layer 134. That is, this additional CMP process provides a slower and more controlled rate of removal of the dielectric layer 118 than the CMP process in the previous step, so that the dielectric layer 118 is not removed and portions of the AMR stack 124, the CMP stop layer 132, and the dielectric layer 134 remain in the trench 122.

Figure 9:
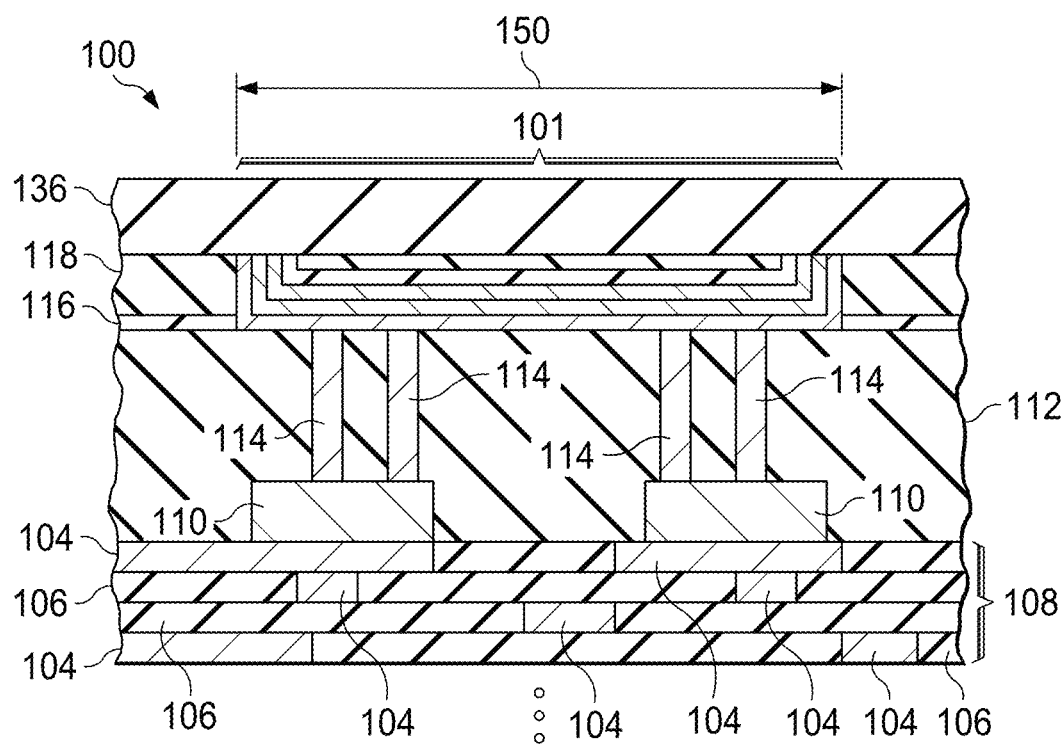
FIG. 9 is a sectional side view of the apparatus shown in FIG. 8 in a subsequent stage of manufacturing according to one or more aspects of the present disclosure.

FIG. 9 is a sectional side view of the apparatus shown in FIG. 8 in a subsequent stage of manufacture according to one or more aspects of the present disclosure, in which a passivation overcoat (PO) layer 136 has been formed over each surface exposed by the CMP process in the previous step. In this implementation of an AMR device 101, the opposing ends of the AMR stack 124 that contact the PO layer 136 are coplanar with upper surfaces of the dielectric layer portions 118, the dielectric layer 134, and each opposing end of the CMP stop layer 132. The PO layer 136 may be formed of silicon oxynitride (SiON), SiN, a combination of oxide and SiN, and/or other materials, perhaps to a thickness of 8,000 Å or otherwise in the range of 5,000-30,000 Å. The PO layer 136 may be formed by PECVD and/or other processes.

Figure 10:
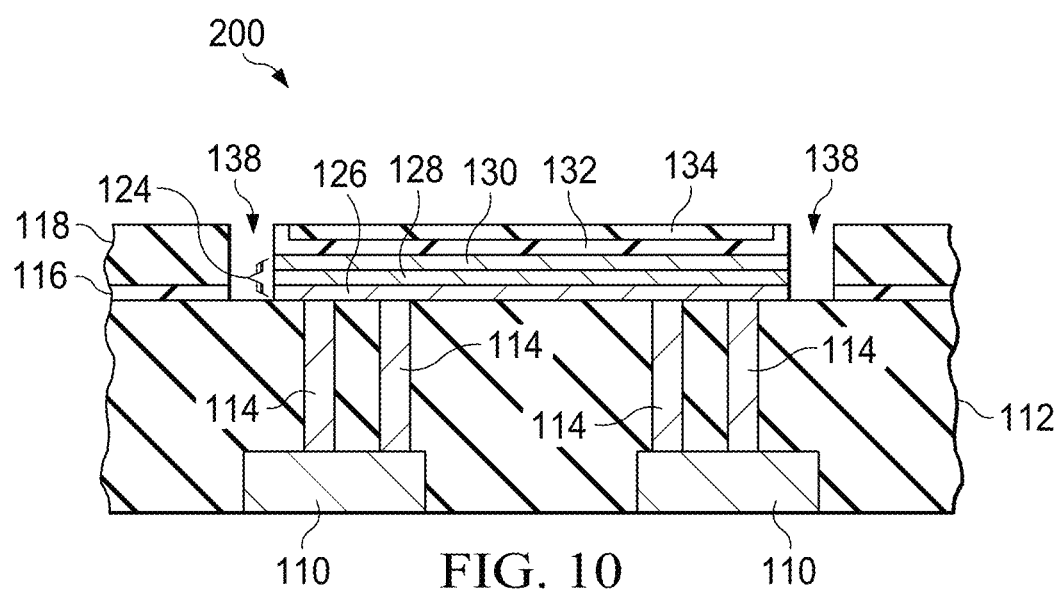
FIG. 10 is a sectional side view of the apparatus shown in FIG. 8 in another example implementation of a subsequent stage of manufacturing according to one or more aspects of the present disclosure.

FIG. 10 is a sectional side view of the apparatus shown in FIG. 8 in another example implementation of a subsequent stage of manufacture according to one or more aspects of the present disclosure and designated by reference number 200. FIG. 10 depicts that, before the PO layer 136 is formed, an etching process may be utilized to remove the sidewalls (i.e., vertically extending portions) of the AMR stack 124. As a result, vertical surfaces of the etch stop layer 116, the dielectric layer 118, the AMR stack 124, and the CMP stop layer 132 are exposed in narrow trenches 138. The etching process may include one or more wet etches and/or other etching processes.

Figure 11:
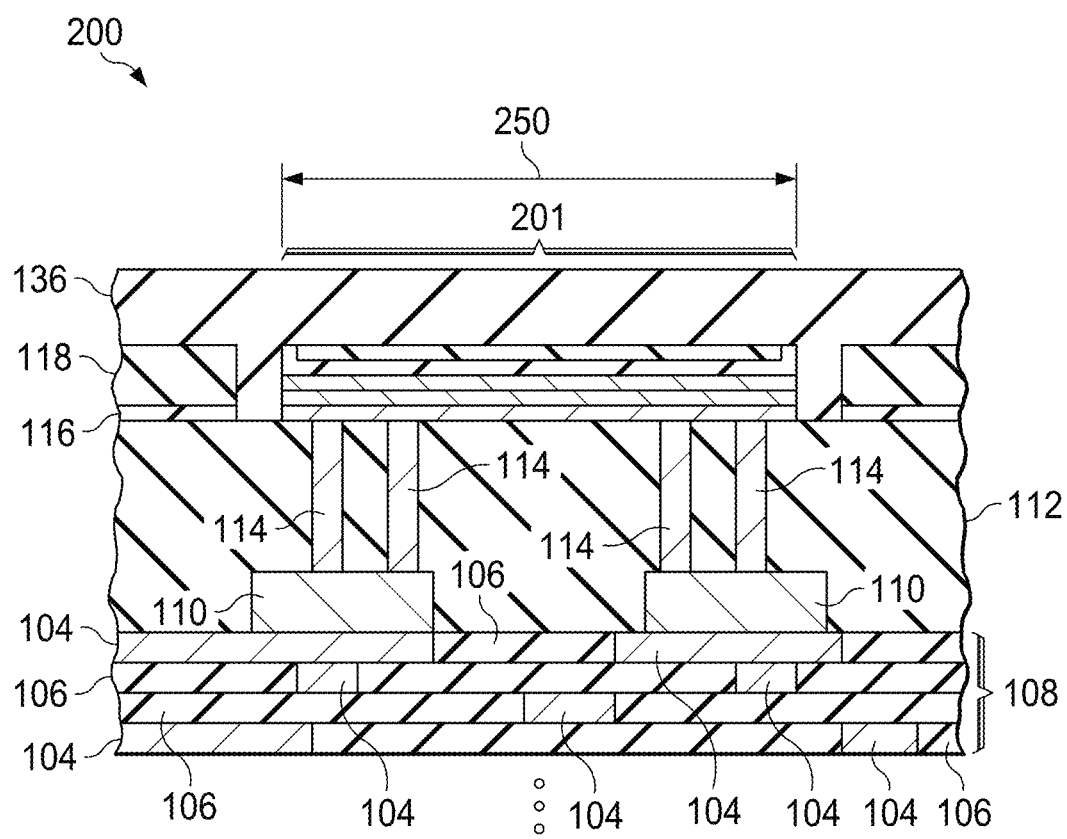
FIG. 11 is a sectional side view of the apparatus shown in FIG. 10 in a subsequent stage of manufacturing according to one or more aspects of the present disclosure.

FIG. 11 is a sectional side view of the apparatus shown in FIG. 10 in a subsequent stage of manufacture according to one or more aspects of the present disclosure. In FIG. 11, the PO layer 136 has been formed as described above with respect to FIG. 9, except that the PO layer 136 in FIG. 11 has also been formed in the trenches 138. In this implementation of an AMR device 201, the opposing ends of the AMR stack 124 that contact the PO layer 136 are coplanar with laterally opposing vertical surfaces of the CMP stop layer 132.

The above-described processes may be advantageously utilized to decrease the minimum possible width and/or spacing of the AMR devices. For example, a minimum possible width 150 of the AMR device 101 shown in FIG. 9, and/or a minimum possible width 250 of the AMR device 201 shown in FIG. 11, may be at least as small as 0.25 microns. For comparison, conventional processes are unable to achieve, or affordably achieve, widths smaller than 2.0 microns. Alternatively, or additionally, the minimum possible spacing between neighboring AMR devices may be at least as small as 0.25 microns, such as in implementations in which the width of the AMR devices is 2.0 microns, among other examples within the scope of the present disclosure.

Figure 12:
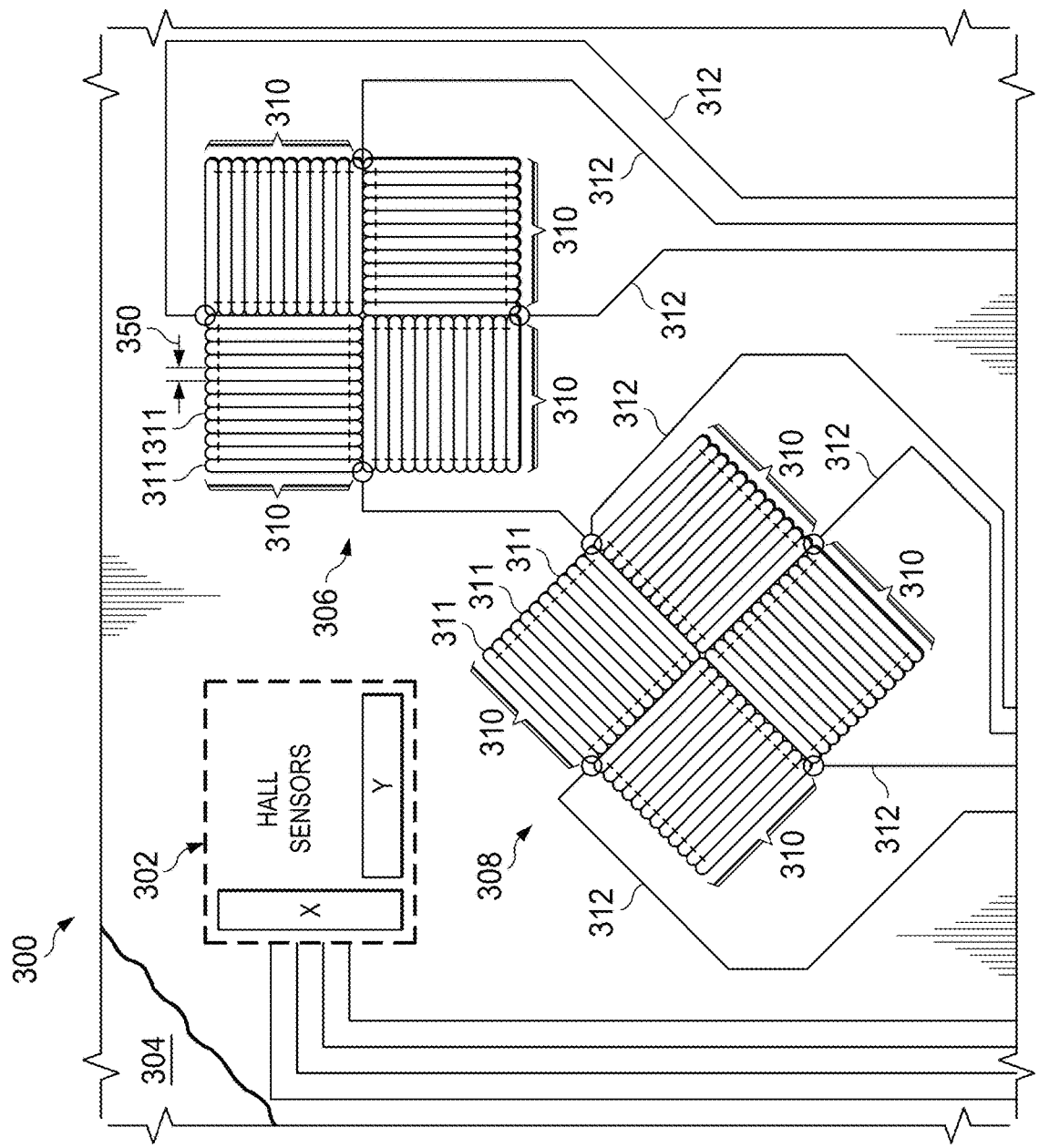
FIG. 12 is a top view of a portion of an example implementation of an integrated circuit device according to one or more aspects of the present disclosure.

FIG. 12 is a top view of a portion of an example implementation of an IC 300 incorporating the apparatus 100 shown in FIG. 9 and/or the apparatus 200 shown in FIG. 11 according to one or more aspects of the present disclosure. The IC 300 includes Hall effect sensors 302 to sense magnetic fields oriented perpendicular to the top surface 304 of the IC 300. The IC 300 also includes a first AMR sensor 306 and a second AMR sensor 308 to sense magnetic fields parallel to the top surface 304, wherein the first and second AMR sensors 306, 308 are offset from one another by 45 degrees. In combination, the Hall effect sensors 302 and the first and second AMR sensors 306, 308 facilitate 360° rotation sensing via a single instance of the IC 300.

The first and second AMR sensors 306, 308 are each implemented by four groups 310 of the AMR device 101 shown in FIG. 9 and/or the AMR device 201 shown in FIG. 11, some of which are designated in FIG. 12 by reference number 311. As described above, each AMR device 311 may have a width 350 (e.g., width 150 in FIG. 9 and/or width 250 in FIG. 11) that may be at least as small as 0.25 microns, and/or the spacing between neighboring ones of the AMR devices 311 may be 0.25 microns or more.

Each group 310 is oriented 90 degrees relative to the neighboring group 310, and the AMR sensors 306, 308 are interconnected by conductors 312 as first and second bridge circuits. Accordingly, the first and second AMR sensors 306, 308 are sensitive to magnetic fields oriented parallel to the top surface 304 of the IC 300, and the signals from the corresponding first and second bridge circuits provide a range of 180 degrees for rotational sensing. In combination with the Hall effect sensors 302, which are sensitive to magnetic fields perpendicular to the top surface 304, a host system can detect rotation through 360° using the signals from the two AMR sensor bridge circuits and the Hall effect sensors 302. Moreover, the angular orientation of the AMR sensors 306, 308, as well as the orientation of the AMR sensors 306, 208 relative to the sensing direction of the Hall effect sensors 302, can be precisely controlled using the semiconductor fabrication processing to a degree that is impractical or impossible using mechanical means to control the relative orientation of two or more discrete sensors as was done in the past.

Figure 13:
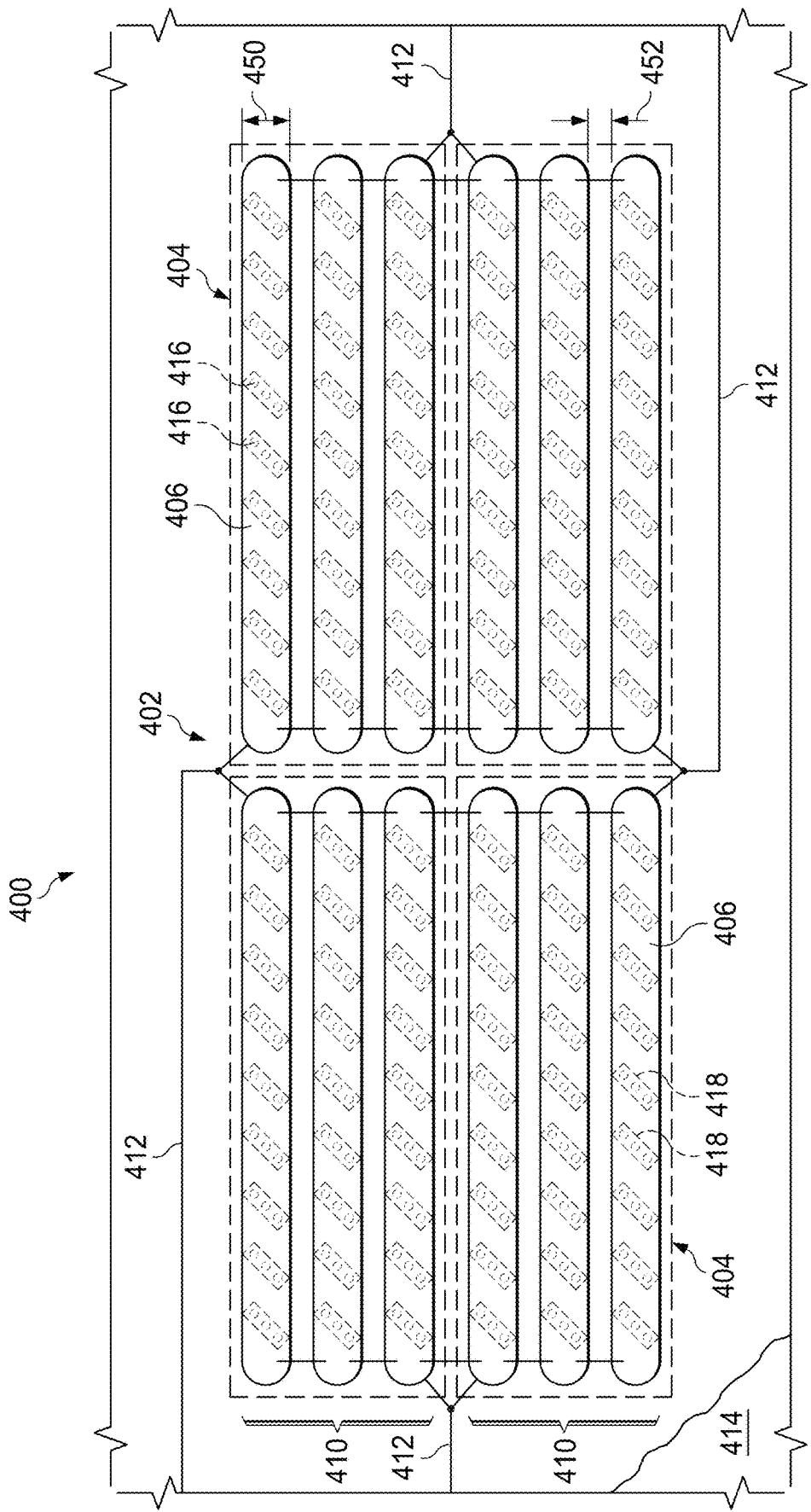
FIG. 13 is a top view of a portion of another example implementation of an integrated circuit device according to one or more aspects of the present disclosure.

FIG. 13 is a top view of a portion of another example implementation of an IC 400 incorporating the apparatus 100 shown in FIG. 9 and/or the apparatus 200 shown in FIG. 11 according to one or more aspects of the present disclosure. The IC 400 includes an AMR sensor 402 utilized for linear sensing applications. The AMR sensor 402 includes four groups 404 of the AMR device 101 shown in FIG. 9 and/or the AMR device 201 shown in FIG. 11, which are designated in FIG. 13 by reference number 406. As described above, each AMR device 406 may have a width 450 (e.g., width 150 in FIG. 9 and/or width 250 in FIG. 11) that may be at least as small as 0.25 microns, and/or the spacing 452 between neighboring ones of the AMR devices 406 may be 0.25 microns or more.

In the example implementation depicted in FIG. 13, each group 404 includes three AMR devices 406, although other numbers are also possible. FIG. 13 also depicts (in dashed lines) vias 416 that connect each AMR device 406 to underlying contacts 418, which are oriented at 45 degrees or otherwise sloped/angled relative to the AMR devices 406. The vias 416 are examples of the vias 114 described above, and the underlying contacts 418 are examples of the contacts 110 described above.

The groups 404 are oriented in two rows 410 each having two groups 404, such that the AMR devices 406 in each row 410 are colinear. The groups 404 are interconnected by conductors 412 to form a bridge circuit. Accordingly, the AMR sensor 402 is sensitive to magnetic fields oriented parallel to the top surface 414 of the IC 400, and the signals from the bridge circuit provide for linear sensing.

In view of the entirety of the present disclosure, including the figures and the claims, a person having ordinary skill in the art will readily recognize that the present disclosure introduces a method comprising: (A) forming a trench in a substrate, wherein: (1) the substrate comprises an IC device, a first dielectric layer, an etch stop layer interposing the IC device and the first dielectric layer, conductive vias extending from the etch stop layer to corresponding contacts of the IC device, and a second dielectric layer interposing the etch stop layer and the IC device; and (2) the trench extends through the first dielectric layer and the etch stop layer to expose ends of the vias and portions of the second dielectric layer; (B) forming an AMR stack on surfaces exposed by forming the trench, including surfaces of the first and second dielectric layers, the etch stop layer, and the vias; (C) forming a CMP stop layer on the AMR stack within the trench; (D) forming a third dielectric layer over the CMP stop layer; and (E) performing CMP to remove each portion of the third dielectric layer and the AMR stack disposed above the CMP stop layer.

The etch stop layer may be SiN and may have a thickness of 500 Å.

The method may further comprise, before forming the AMR stack, forming a barrier layer on the surfaces exposed by forming the trench, wherein forming the AMR stack comprises forming the AMR stack on all exposed surfaces of the barrier layer. The barrier layer may be TaN.

Forming the AMR stack may comprise forming a layer of NiFe and forming a layer of AlN on the NiFe layer.

The CMP stop layer may be SiN and may have a thickness of 500 Å.

The third dielectric layer may be an oxide having a thickness of 5000 Å.

The method may further comprise forming a PO layer over each surface exposed by the CMP.

The present disclosure also introduces an apparatus comprising: an integrated circuit device comprising a plurality of metallization layers for interconnecting underlying electronic devices; a plurality of contacts formed on corresponding conductors of an uppermost one of the metallization layers; a planarized first dielectric layer covering the contacts and the uppermost one of the metallization layers; an AMR stack formed on the first dielectric layer between vertically aligned portions of an etch stop layer formed on the first dielectric layer and a second dielectric layer formed on the etch stop layer; a plurality of vias each extending through the first dielectric layer to electrically connect the AMR stack and two of the contacts; a CMP stop layer formed on the AMR stack; a third dielectric layer formed on the CMP stop layer; and a PO layer contacting the second dielectric layer portions, the third dielectric layer, and each opposing end of the AMR stack and the CMP stop layer.

The AMR stack may comprise a layer of NiFe and a layer of AlN on the NiFe layer.

The AMR stack may comprise a barrier layer, a layer of NiFe on the barrier layer, and a layer of AlN on the NiFe layer. The barrier layer may be TaN.

The opposing ends of the AMR stack contacting the PO layer may be coplanar with upper surfaces of the second dielectric layer portions, the third dielectric layer, and each opposing end of the CMP stop layer.

The opposing ends of the AMR stack contacting the PO layer may be coplanar with laterally opposing vertical surfaces of the CMP stop layer. In such implementations, among others within the scope of the present disclosure, the PO layer may include: a first portion extending horizontally over upper surfaces of the second dielectric layer portions, the third dielectric layer, and each opposing end of the CMP stop layer; and second portions each extending vertically between the first portion and the first dielectric layer.

The AMR stack may have a width not greater than 0.25 microns.

The underlying electronic devices may comprise one or more Hall effect sensors, and the AMR stack may be one of a plurality of AMR stacks interconnected to form an angular measurement device.

The AMR stack may be one of a plurality of AMR stacks interconnected to form a linear measurement device. The AMR stacks may be in the form of elongated strips. Neighboring ones of the AMR strips may be separated by a width not greater than 0.25 microns.

The present disclosure also introduces a method of forming an electronic device comprising: forming a trench in a first dielectric layer over a semiconductor substrate; forming an AMR stack on sidewalls and a bottom of the trench, the AMR stack including a portion overlying the substrate lateral to the trench; forming a second dielectric layer within the trench, the second dielectric layer overlying the substrate lateral to the trench; removing the portion of the second dielectric layer overlying the substrate lateral to the trench; and removing the portion of the AMR stack overlying the substrate lateral to the trench.

Forming the trench may expose vias that conductively connect to an electronic device formed in or over the semiconductor substrate, and the AMR stack may include a conductive layer that conductively connects to the contacts.

The AMR stack may include a TaN layer in contact with the first dielectric layer, a ferromagnetic layer in contact with the TaN layer, and an AlN layer in contact with the ferromagnetic layer.

The AMR stack may include a horizontal portion between sidewall portions, and the method may further comprise removing the sidewall portions thereby exposing a third dielectric layer that underlies the AMR stack.

The AMR stack may conductively connect to vias that extend through a third dielectric layer that underlies the AMR stack, and the vias may conductively connect to an IC device that underlies the third dielectric layer.

The foregoing outlines features of several embodiments so that a person having ordinary skill in the art may better understand the aspects of the present disclosure. A person having ordinary skill in the art will appreciate that they may readily use the present disclosure as a basis for designing or modifying other processes and structures for carrying out the same functions and/or achieving the same benefits of the embodiments introduced herein. A person having ordinary skill in the art will also realize that such equivalent constructions do not depart from the scope of the present disclosure, and that they may make various changes, substitutions and alterations herein without departing from the scope of the present disclosure.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. A method comprising:
    forming a trench in a substrate, wherein:
        the substrate comprises an integrated circuit (IC) device, a first dielectric layer, an etch stop layer interposing the IC device and the first dielectric layer, conductive vias extending from the etch stop layer to corresponding contacts of the IC device, and a second dielectric layer interposing the etch stop layer and the IC device; and
        the trench extends through the first dielectric layer and the etch stop layer to expose ends of the vias and portions of the second dielectric layer;
    forming an anisotropic magnetoresistive (AMR) stack on surfaces exposed by forming the trench, including surfaces of the first and second dielectric layers, the etch stop layer, and the vias;
    forming a chemical-mechanical planarization (CMP) stop layer on the AMR stack within the trench;
    forming a third dielectric layer over the CMP stop layer; and
    performing CMP to remove each portion of the third dielectric layer and the AMR stack disposed above the CMP stop layer.

2. The method of claim 1 wherein the etch stop layer is silicon nitride (SiN).

3. The method of claim 2 wherein the etch stop layer has a thickness of 500 angstroms.

4. The method of claim 1 further comprising, before forming the AMR stack, forming a barrier layer on the surfaces exposed by forming the trench, wherein forming the AMR stack comprises forming the AMR stack on all exposed surfaces of the barrier layer.

5. The method of claim 4 wherein the barrier layer is tantalum nitride (TaN).

6. The method of claim 1 wherein forming the AMR stack comprises forming a layer of permalloy (NiFe) and forming a layer of aluminum nitride (AlN) on the NiFe layer.

7. The method of claim 1 wherein the CMP stop layer is silicon nitride (SiN).

8. The method of claim 7 wherein the CMP stop layer has a thickness of 500 angstroms.

9. The method of claim 1 wherein the third dielectric layer is an oxide having a thickness of 5000 angstroms.

10. The method of claim 1 further comprising forming a passivation (PO) layer over each surface exposed by the CMP.

11. A method of forming an electronic device, comprising:
    forming a trench in a first dielectric layer over a semiconductor substrate;
    forming an anisotropic magnetoresistive (AMR) stack on sidewalls and a bottom of the trench, the AMR stack including a portion overlying the substrate lateral to the trench;
    forming a second dielectric layer within the trench, the second dielectric layer including a portion overlying the substrate lateral to the trench;
    removing the portion of the second dielectric layer overlying the substrate lateral to the trench; and
    removing the portion of the AMR stack overlying the substrate lateral to the trench,
    wherein forming the trench exposes vias that conductively connect to an electronic device formed in or over the semiconductor substrate, and wherein the AMR stack includes a conductive layer that conductively connects to the vias.

12. The method of claim 11 wherein the AMR stack includes a tantalum nitride (TaN) layer in contact with the first dielectric layer, a ferromagnetic layer in contact with the TaN layer, and an aluminum nitride (AlN) layer in contact with the ferromagnetic layer.

13. The method of claim 11 wherein the AMR stack includes a horizontal portion between sidewall portions, and wherein the method further comprises removing the sidewall portions thereby exposing a third dielectric layer that underlies the AMR stack.

14. The method of claim 11 wherein the AMR stack conductively connects to vias that extend through a third dielectric layer that underlies the AMR stack, and wherein the vias conductively connect to an integrated circuit (IC) device that underlies the third dielectric layer.

15. A method of forming an electronic device, comprising:
    forming a trench in a first dielectric layer over a semiconductor substrate;

forming an anisotropic magnetoresistive (AMR) stack on sidewalls and a bottom of the trench, the AMR stack including a portion overlying the substrate lateral to the trench;

forming a second dielectric layer within the trench, the second dielectric layer including a portion overlying the substrate lateral to the trench;

removing the portion of the second dielectric layer overlying the substrate lateral to the trench; and removing the portion of the AMR stack overlying the substrate lateral to the trench, wherein the AMR stack includes a tantalum nitride (TaN) layer in contact with the first dielectric layer, a ferromagnetic layer in contact with the TaN layer, and an aluminum nitride (AlN) layer in contact with the ferromagnetic layer.

16. A method of forming an electronic device, comprising:

forming a trench in a first dielectric layer over a semiconductor substrate;

forming an anisotropic magnetoresistive (AMR) stack on sidewalls and a bottom of the trench, the AMR stack including a portion overlying the substrate lateral to the trench;

forming a second dielectric layer within the trench, the second dielectric layer including a portion overlying the substrate lateral to the trench;

removing the portion of the second dielectric layer overlying the substrate lateral to the trench; and removing the portion of the AMR stack overlying the substrate lateral to the trench, wherein the AMR stack includes a horizontal portion between sidewall portions, and wherein the method further comprises removing the sidewall portions thereby exposing a third dielectric layer that underlies the AMR stack.

17. A method of forming an electronic device, comprising:

forming a trench in a first dielectric layer over a semiconductor substrate;

forming an anisotropic magnetoresistive (AMR) stack on sidewalls and a bottom of the trench, the AMR stack including a portion overlying the substrate lateral to the trench;

forming a second dielectric layer within the trench, the second dielectric layer including a portion overlying the substrate lateral to the trench;

removing the portion of the second dielectric layer overlying the substrate lateral to the trench; and removing the portion of the AMR stack overlying the substrate lateral to the trench, wherein the AMR stack conductively connects to vias that extend through a third dielectric layer that underlies the AMR stack, and wherein the vias conductively connect to an integrated circuit (IC) device that underlies the third dielectric layer.

* * * * *